US012658413B2

(12) United States Patent
Chen et al.

(10) Patent No.: US 12,658,413 B2
(45) Date of Patent: Jun. 16, 2026

(54) DEVICE FOR ADJUSTING POSITION OF CHAMBER AND PLASMA PROCESS CHAMBER INCLUDING THE SAME FOR SEMICONDUCTOR MANUFACTURING

(71) Applicant: TAIWAN SEMICONDUCTOR MANUFACTURING COMPANY, LTD., Hsinchu (TW)

(72) Inventors: Ming Che Chen, Hsinchu (TW); Wei-Chen Liao, Guosing Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 464 days.

(21) Appl. No.: 18/231,165

(22) Filed: Aug. 7, 2023

(65) Prior Publication Data

US 2023/0386805 A1      Nov. 30, 2023

Related U.S. Application Data

(62) Division of application No. 17/358,808, filed on Jun. 25, 2021, now Pat. No. 11,955,322.

(51) Int. Cl.
*H01J 37/32* (2006.01)
*B08B 7/00* (2006.01)
*C23C 16/44* (2006.01)
*C23C 16/455* (2006.01)

(52) U.S. Cl.
CPC ...... *H01J 37/32862* (2013.01); *B08B 7/0071* (2013.01); *C23C 16/4405* (2013.01); *C23C*

*16/45536* (2013.01); *H01J 37/32082* (2013.01); *H01J 37/32798* (2013.01)

(58) Field of Classification Search
None
See application file for complete search history.

(56) References Cited

U.S. PATENT DOCUMENTS

| | | | |
|---|---|---|---|
| 6,513,452 B2 | 2/2003 | Shan et al. | |
| 6,602,793 B1 | 8/2003 | Masterson | |
| 6,753,499 B1 * | 6/2004 | Yasaka | G01N 29/223 |
| | | | 374/117 |
| 7,611,990 B2 | 11/2009 | Yoon et al. | |
| 9,887,071 B2 | 2/2018 | Chen et al. | |

(Continued)

FOREIGN PATENT DOCUMENTS

| | | |
|---|---|---|
| TW | 201327659 A | 7/2013 |
| TW | 201519354 A | 5/2015 |

(Continued)

*Primary Examiner* — Jason Berman
(74) *Attorney, Agent, or Firm* — STUDEBAKER BRACKETT PLLC

(57) ABSTRACT

A device for a plasma processing chamber includes a base, an upper portion attached to the base and extending transverse to the base, and one or more first through holes defined in the base. The one or more first through holes correspond to one or more openings defined in the plasma processing chamber for attaching the device. The device further includes a second through hole defined in the upper portion, and a gauge located in the second through hole, the gauge configured for recording a position of the plasma processing chamber and a shift in the position of the plasma processing chamber.

20 Claims, 10 Drawing Sheets

(56) References Cited

U.S. PATENT DOCUMENTS

| | | | |
|---|---|---|---|
| 2005/0189075 A1 | 9/2005 | Pan et al. | |
| 2007/0252969 A1* | 11/2007 | Ueno | G03F 7/70725 |
| | | | 355/72 |
| 2015/0334849 A1 | 11/2015 | Tsubota | |
| 2016/0148789 A1 | 5/2016 | Chen et al. | |
| 2019/0237613 A1* | 8/2019 | Wang | H01L 21/67259 |
| 2020/0365367 A1 | 11/2020 | Yoshino et al. | |
| 2022/0139760 A1 | 5/2022 | Tsubota et al. | |

FOREIGN PATENT DOCUMENTS

| | | | |
|---|---|---|---|
| TW | 202044930 A | 12/2020 | |
| TW | 202114498 A | 4/2021 | |
| WO | 00/07232 A | 2/2000 | |

* cited by examiner

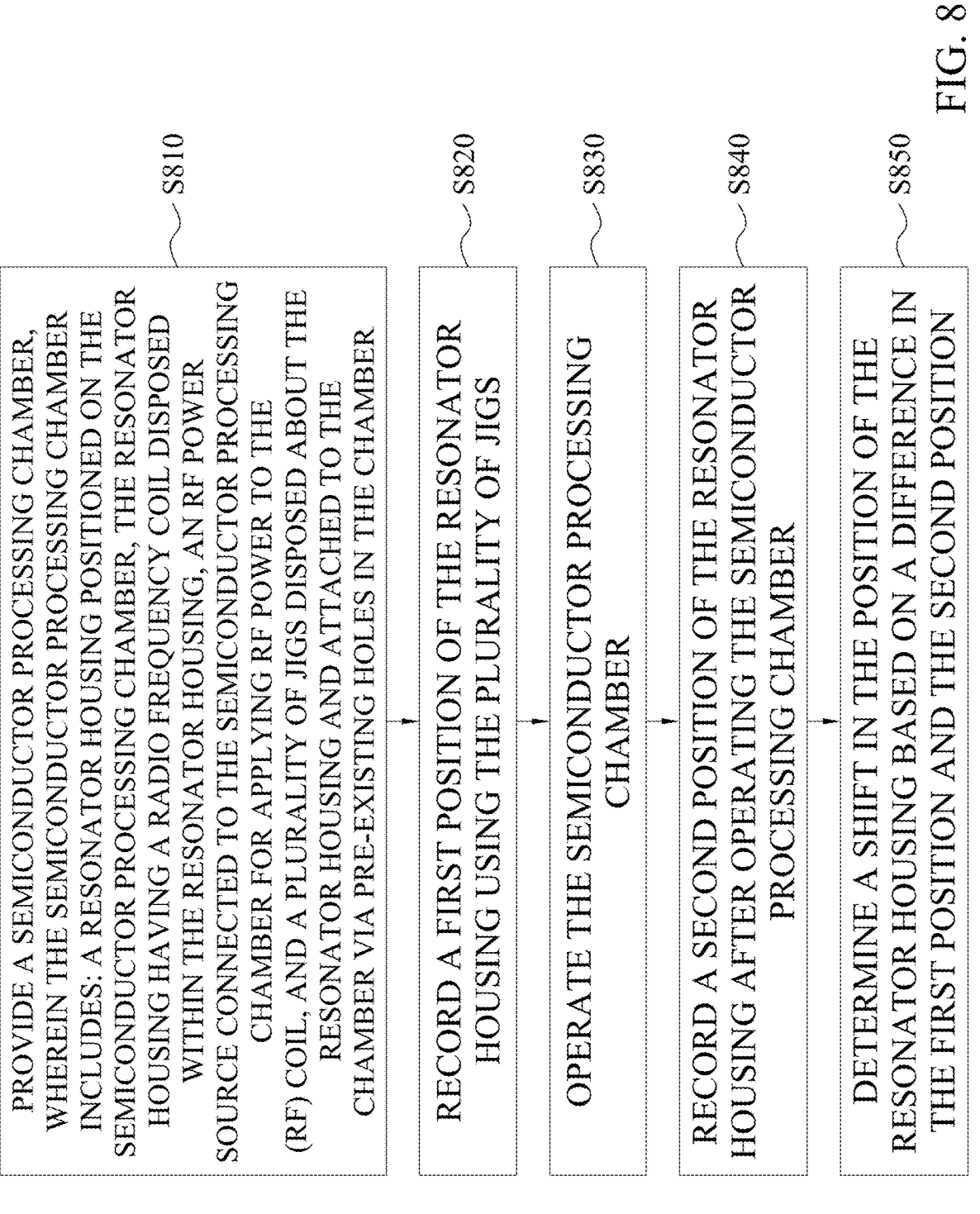

PROVIDE A SEMICONDUCTOR PROCESSING CHAMBER, WHEREIN THE SEMICONDUCTOR PROCESSING CHAMBER INCLUDES: A RESONATOR HOUSING POSITIONED ON THE SEMICONDUCTOR PROCESSING CHAMBER, THE RESONATOR HOUSING HAVING A RADIO FREQUENCY COIL DISPOSED WITHIN THE RESONATOR HOUSING, AN RF POWER SOURCE CONNECTED TO THE SEMICONDUCTOR PROCESSING CHAMBER FOR APPLYING RF POWER TO THE (RF) COIL, AND A PLURALITY OF JIGS DISPOSED ABOUT THE RESONATOR HOUSING AND ATTACHED TO THE CHAMBER VIA PRE-EXISTING HOLES IN THE CHAMBER — S810

RECORD A FIRST POSITION OF THE RESONATOR HOUSING USING THE PLURALITY OF JIGS — S820

OPERATE THE SEMICONDUCTOR PROCESSING CHAMBER — S830

RECORD A SECOND POSITION OF THE RESONATOR HOUSING AFTER OPERATING THE SEMICONDUCTOR PROCESSING CHAMBER — S840

DETERMINE A SHIFT IN THE POSITION OF THE RESONATOR HOUSING BASED ON A DIFFERENCE IN THE FIRST POSITION AND THE SECOND POSITION — S850

DEVICE FOR ADJUSTING POSITION OF CHAMBER AND PLASMA PROCESS CHAMBER INCLUDING THE SAME FOR SEMICONDUCTOR MANUFACTURING

CROSS REFERENCE TO RELATED APPLICATION

This application is a divisional application of and claims priority under 35 U.S.C. § 120 to U.S. non-provisional application Ser. No. 17/358,808 filed Jun. 25, 2021, the entire contents of which are incorporated herein by reference.

BACKGROUND

Physical vapor deposition (PVD), or sputtering, is a process used in the fabrication of electronic devices. PVD is a plasma process performed in a vacuum chamber where a negatively biased target is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate support pedestal disposed within the chamber.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 8 is a flowchart of a method of determining change in position of a resonator housing, according to embodiments of the disclosure.

2

DETAILED DESCRIPTION

Figure 1:
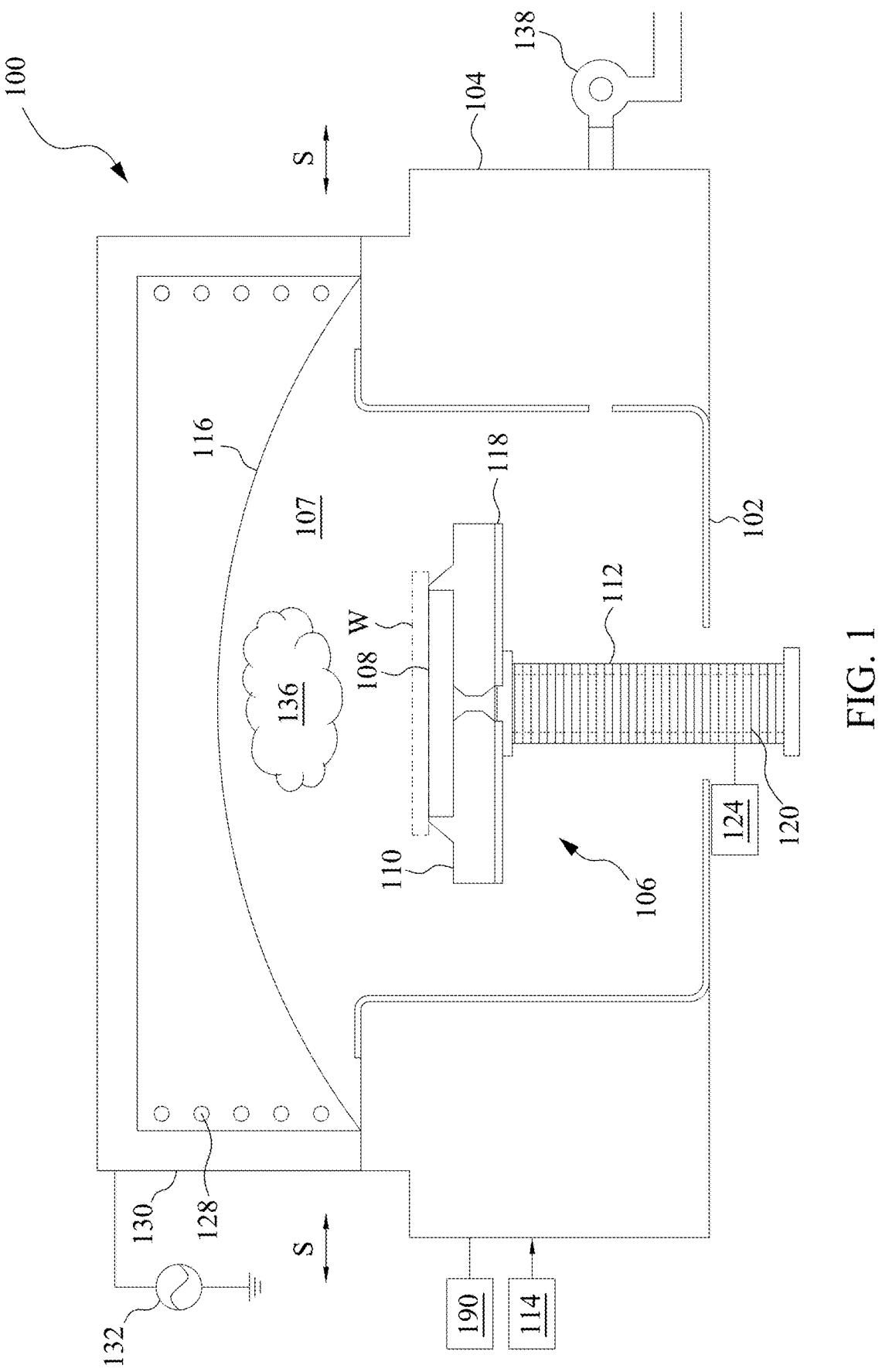
FIG. 1 illustrates a semiconductor processing chamber.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Embodiments of the disclosure generally relate to pre-clean chambers of a plasma processing apparatus, such as a physical vapor deposition (PVD) apparatus, and methods used to correct the position of the RF resonator of the pre-clean chamber. More particularly, embodiments of the disclosure are directed to one or more jigs (or fixtures) that are configured to record an original position of the RF resonator (coil) and reposition the pre-clean RF coil to the original position after a shift in the position of the resonator housing.

In the fabrication of semiconductor integrated circuits, metal conductor lines are used to interconnect the multiple components in device circuits on a semiconductor substrate. A general process used in the deposition of metal conductor line patterns on semiconductor substrates includes deposition of a conducting layer over the semiconductor substrate, formation of a photoresist mask or other hard masks made of, such as titanium oxide or silicon oxide, in the form of the desired metal conductor line pattern, using lithographic techniques, subjecting the semiconductor substrate to a dry etching process to remove the conducting layer from the areas not covered by the mask, thereby leaving the metal layer in the form of the masked conductor line pattern, and removing the mask layer typically using reactive plasma, thereby exposing the top surface of the metal conductor lines. Typically, multiple alternating layers of electrically conductive and insulative materials are sequentially deposited on the semiconductor substrate, and conductive layers at different levels over the semiconductor substrate may be electrically connected to each other by etching vias, or openings, in the insulative layers and filling the vias using aluminum, tungsten or other metal to establish electrical connection between the conductive layers. Deposition of conductive layers over the semiconductor substrate can be carried out using physical vapor deposition (PVD). Physical vapor deposition (PVD) can include evaporation, e-beam evaporation, plasma spray deposition, and sputtering. In sputtering, semiconductor substrates are produced by the deposition or "sputtering" of a metallic layer on the surface of a semiconductor substrate.

Physical vapor deposition (PVD) systems typically include a first air lock loading chamber in which cassettes containing a plurality of semiconductor substrates to be processed are placed and from which the semiconductor substrates are transported to a second vacuum chamber (or transportation chamber) using a conveyor or a wafer handling robot. Subsequently, the semiconductor substrates are placed on a rotating table or stage in the plasma deposition chamber. After the deposition process, the processed semiconductor substrates are again transported back through the transportation chamber, to the loading chamber and then back into the cassette for further handling or processing.

Prior to physical vapor deposition, the semiconductor substrates undergo a pre-clean process in a pre-clean chamber to remove any chemical residue or oxide, which may be formed when the semiconductor substrate is exposed to the atmosphere. Any chemical residue or oxide, which remains on the semiconductor substrate can act as a dielectric shield and impede the PVD film from uniformly adhering to the surface. The pre-clean chamber applies a light, non-selective, non-reactive plasma etch to the semiconductor substrate to remove chemical residues including metal oxide or metal compounds, such as $Cu_2O$, $CuO$, $Cu(OH)_2$, $CuCO_3$ and $CuF_x$ remaining on conductive patterns formed over the semiconductor substrate surface. It also removes a thin layer of oxide formed on the surface of the conductive patterns formed over the semiconductor substrate when the semiconductor substrate is exposed to the atmosphere, and exposes a fresh metal surface prior to the metallization step.

Transferring the semiconductor substrates between the pre-clean chamber and other components of the semiconductor substrate processing system, for instance, the physical vapor deposition (PVD) chamber may cause vibration, which in turn causes a shift in the position of an RF coil of the pre-clean chamber. In some embodiments, a pre-clean process using the pre-clean chamber causes the shift. Maintenance operations of the pre-clean chamber may also cause a positional shift in the RF coil. The shift in the RF coil may cause non-uniform etching of the semiconductor substrate, which may cause errors or defects in other semiconductor processing operations.

Embodiments of the disclosure are directed to jigs (or fixtures) that are configured to record the original position of the RF coil and to re-position the RF coil to its original position prior to shifting.

Although embodiments of the disclosure are discussed with reference to pre-clean chambers, embodiments are not limited thereto. Embodiments of the disclosure are equally applicable to other processing chambers such as plasma deposition chambers wherein it is required to correct positional shifts of any part of the processing chambers, without departing from the scope of the disclosure.

FIG. 1 illustrates a semiconductor processing chamber including a base 102 and an outer wall 104 that includes a port for receiving a semiconductor substrate W in chamber 100. For the purposes discussion herein, it is assumed that the semiconductor processing chamber is a pre-clean chamber 100. Once introduced into chamber 100, semiconductor substrate W is transferred to a substrate lift 106, which is comprised of a pedestal 108, an insulator 110, an insulator base 118, a shaft 120 and a bellows assembly 112. The semiconductor substrate W is seated upon pedestal 108 comprising an RF-biased, disk-shaped platform made from aluminum, titanium or other non-reactive metal. The pedestal 108 is supported and insulated by insulator 110.

The insulator 110 is a one-piece insulator, including a non-reactive insulative material such as ceramic or quartz. The insulator 110 insulates the sides and bottom of pedestal 108 and collimates the RF power to the top surface of pedestal 108 and, hence, through semiconductor substrate W. The insulator 110 is supported by insulator base 118. The shaft 120 supports pedestal 108, insulator 110 and insulator base 118 and moves semiconductor substrate W vertically between a release position, where semiconductor substrate W is introduced from and is removed from the chamber 100, and a processing position, where semiconductor substrate W is maintained during the etching process. The bellows assembly 112 surrounds shaft 120 and isolates shaft 120 when chamber 100 is under vacuum. The chamber cover 116 covers chamber 100 and seals chamber 100 during semiconductor substrate processing.

The substrate support including the pedestal 108, the insulator 110, the insulator base 118, the shaft 120, and the bellows assembly 112 functions as an RF cathode connected to an RF power supply 124. The chamber 100 also includes one or more deposition shields, cover rings or the like circumscribing various chamber components to prevent unwanted reaction between such components and ionized process material.

To create a desired plasma for processing the semiconductor substrate W an RF coil 128 is provided in the chamber 100. The coil 128 is disposed within a resonator housing 130 disposed above the chamber cover 116 (or lid). The coil 128 is vertically aligned with the outer walls 104 of the chamber 100 and is powered by an RF coil power source 132.

During pre-clean processing, RF power is supplied to chamber 100. Gas inlet 114 introduces argon gas or other appropriate gases into the chamber for the pre-clean etching. A plasma 136 is created in the process cavity 107 when the RF coil 128 inductively couples power from RF coil power source 132 into the process gas in the chamber 100. RF power is then supplied to chamber 100, causing high voltage and high current to strike an argon plasma in the chamber. When the RF power is supplied to chamber 100, the bottom surface of chamber cover 116 acts as an anode and substrate support acts as a cathode. Positively charged argon ions are attracted to the negatively charged substrate support. These ions bombard the semiconductor substrate W on pedestal 108 and etch the surface thereof. To establish and maintain the necessary environmental conditions in the chamber 100, a pressure control device 138 is connected to the chamber 100. The pressure control device 138 is for example a turbo pump or other similar pump capable of establishing near vacuum conditions (i.e., chamber pressure in the mTorr range).

During the etch process, oxide and other particulates are released from the semiconductor substrate and can be deposited on the insulator 110 and other components in the chamber 100. This poses a problem as these particulates can be dislodged during later processes and can adhere to the surface of other semiconductor substrates, thus reducing device performance. Consequently, it becomes necessary to clean and resurface insulator 110 between uses. However, these clean cleaning operations can cause shift the position of the resonator housing 130 including the RF coil 128 (generally indicated by the arrows S).

The chamber 100 is controlled by a system controller 190 that facilitates the control and automation of the processing chamber 100 and typically includes a central processing unit (CPU), memory, and support circuits (or I/O). The CPU may be one of any form of computer processors that are used in industrial settings for controlling various system functions, substrate movement, chamber processes, and support hardware (e.g., sensors, robots, motors, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits include cache, power supplies, clock circuits, input/output circuitry, subsystems, and the like. A program (or computer instructions) readable by the system controller 190 determines which tasks to be performed on the substrate. The program is software readable by the system controller 190 that includes code to perform tasks relating to monitoring, execution and control of the movement and various process recipe tasks and recipe steps being performed in the processing chamber 100. For example, the system controller 190 comprises program code that includes a substrate positioning instruction set to operate the substrate support, a gas flow control instruction set to operate flow control valves to set a flow of sputtering gas to the processing chamber 100, a gas pressure control instruction set to operate a throttle valve or gate valve to maintain a pressure in the processing chamber 100, a temperature control instruction set to control a temperature control system in the substrate support, and a process monitoring instruction set to monitor the process in the processing chamber 100.

Figure 2B:
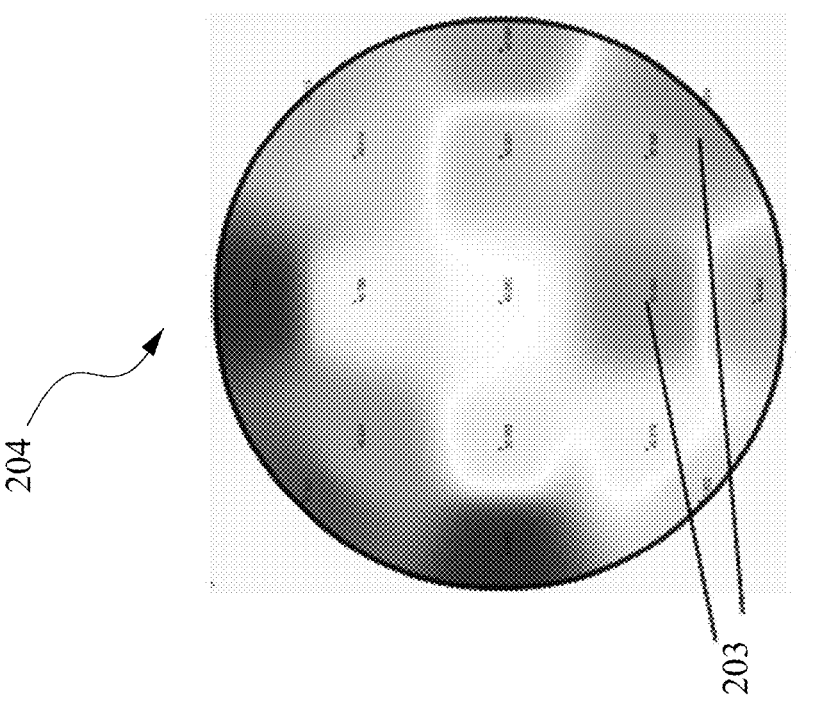
FIG. 2B illustrates the wafer map of the surface of the semiconductor substrate after positional shift.
Figure 2A:
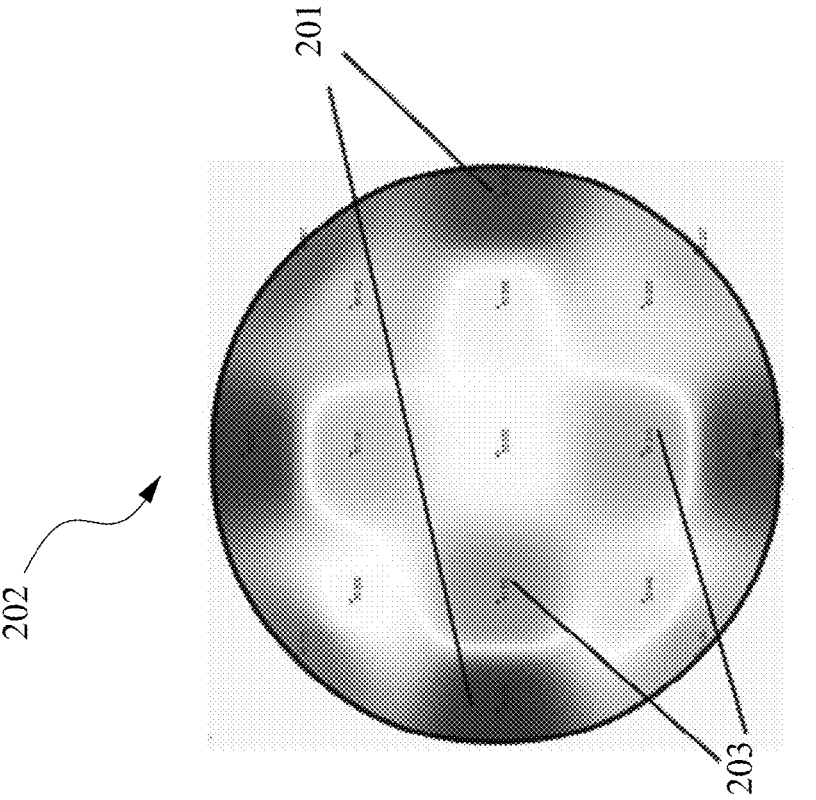
FIG. 2A illustrates a wafer map of the surface of a semiconductor substrate before positional shift of the RF coil.

In order to reposition the RF coil 128, an operator has to manually relocate the RF coil 128 to its original position. In order to determine the original position, an operator refers to a wafer map that depicts the thickness of films processed by the pre-clean chamber on different locations on the surface of the semiconductor substrate. FIG. 2A illustrates the wafer map 202 of the surface of the semiconductor substrate W before positional shift of the RF coil and FIG. 2B illustrates the wafer map 204 of the surface of the semiconductor substrate W after positional shift. The wafer maps 202 and 204 illustrate the difference in thickness of the film subjected to the pre-clean operation on the surface of the semiconductor substrate W in color gradient. In some embodiments, a silicon oxide layer is formed on a Si wafer by thermal oxidation or a CVD deposition and thicknesses of various locations of the silicon oxide layer are measured before and after the pre-clean operation. For instance, in FIGS. 2A and 2B, areas 201 indicate a thinner remaining film compared to areas 203 having a relatively thicker film. The operator then manually moves the resonator housing 130 including the RF coil in order to reposition the RF coil to its original position and to thereby obtain the wafer map 202 again. However, this manual operation is an iterative process (trial and error) and is error prone since the original position of the resonator housing 130 is not readily known. It is desirable to record the original position of the resonator housing 130 (and thereby of the coil 128) in addition to limiting movement of the resonator housing 130.

Figure 3A:
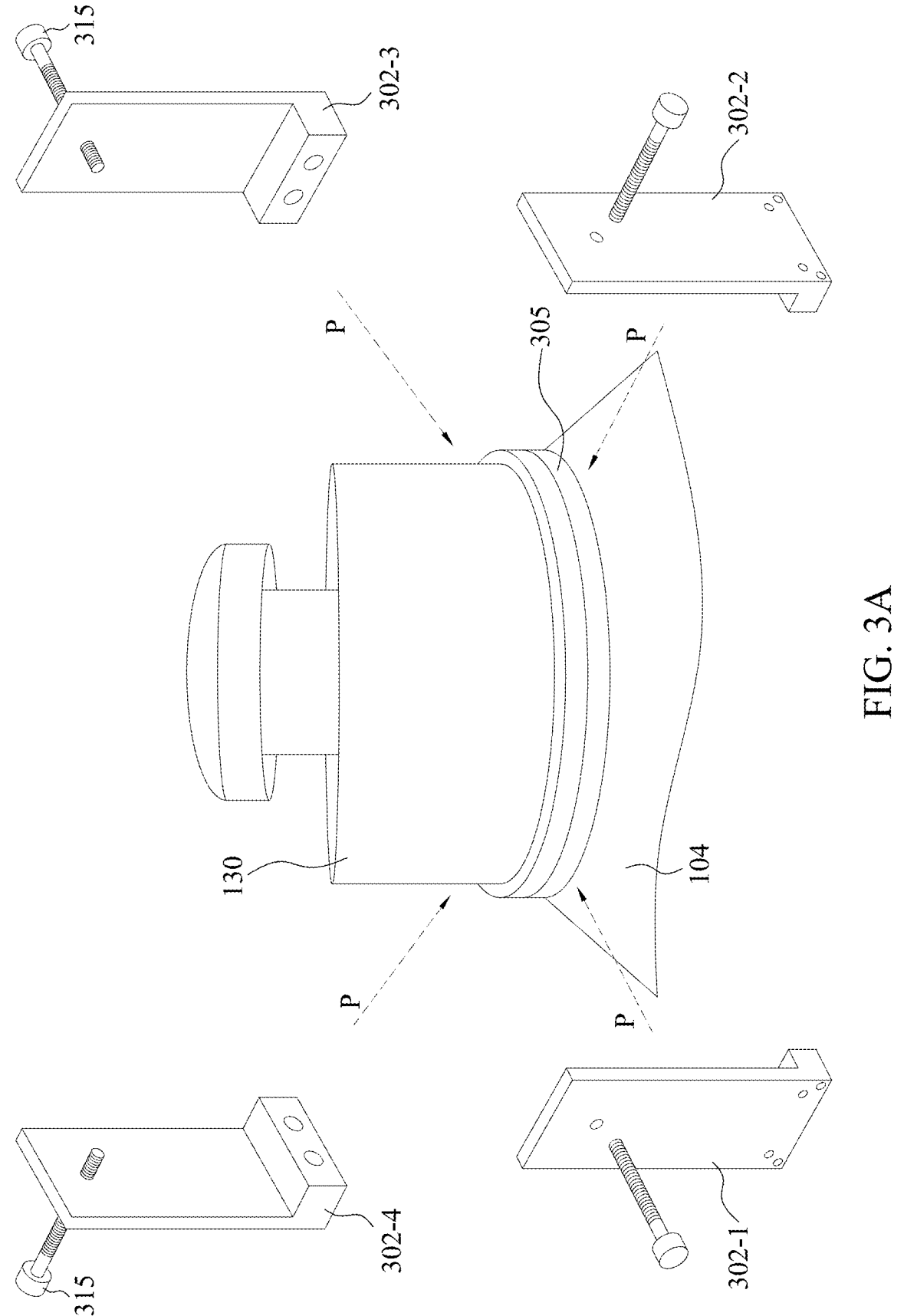
FIG. 3A is a front view of the chamber of FIG. 1 and jigs for installing on an outer surface thereof, according to embodiments of the disclosure.

FIG. 3A is a front view of the chamber 100 and four jigs 302-1, 302-2, 302-3, and 302-4 for installing on an outer surface thereof, according to embodiments of the disclosure. The four jigs (also referred to fixtures) 302-1, 302-2, 302-3, and 302-4 (collectively referred as jigs 302) are designed to be coupled to the chamber 100 via holes 305 in the outer wall 104 of the chamber 100. In some embodiments, the hole 305 are pre-existing holes in the outer wall 104 of the chamber 100. For the purposes of discussion herein, "pre-existing" refers to holes in the chamber that were formed during the manufacture of the chamber and were not formed in the chamber for specifically using the jigs. The arrows P illustrate the direction in which each jig 302 is coupled to the chamber 100 using fasteners (e.g., bolts, screws, pins). In view illustrated in FIG. 3A, the holes 305 for the jigs 302-3 and 302-4 are hidden from view. In other embodiments, special holes for use with the jigs are formed in addition to the pre-existing holes.

Each jig 302 includes a gauge for recording an initial, standard or ideal position of the resonator housing 130, which can provide a uniform film thickness after the pre-clean operation, and recording the position of the resonator housing 130 after repositioning (realigning) the resonator housing 130. The gauge can be any type of device that can record the position of the housing. In some embodiments, a screw 315 or a threaded bolt or similar is used as a gauge for recording the position of the housing. The screw 315 can be moved into and out of the jig 302 for adjusting a position thereof for contacting with or separating from the resonator housing 130.

Figure 3B:
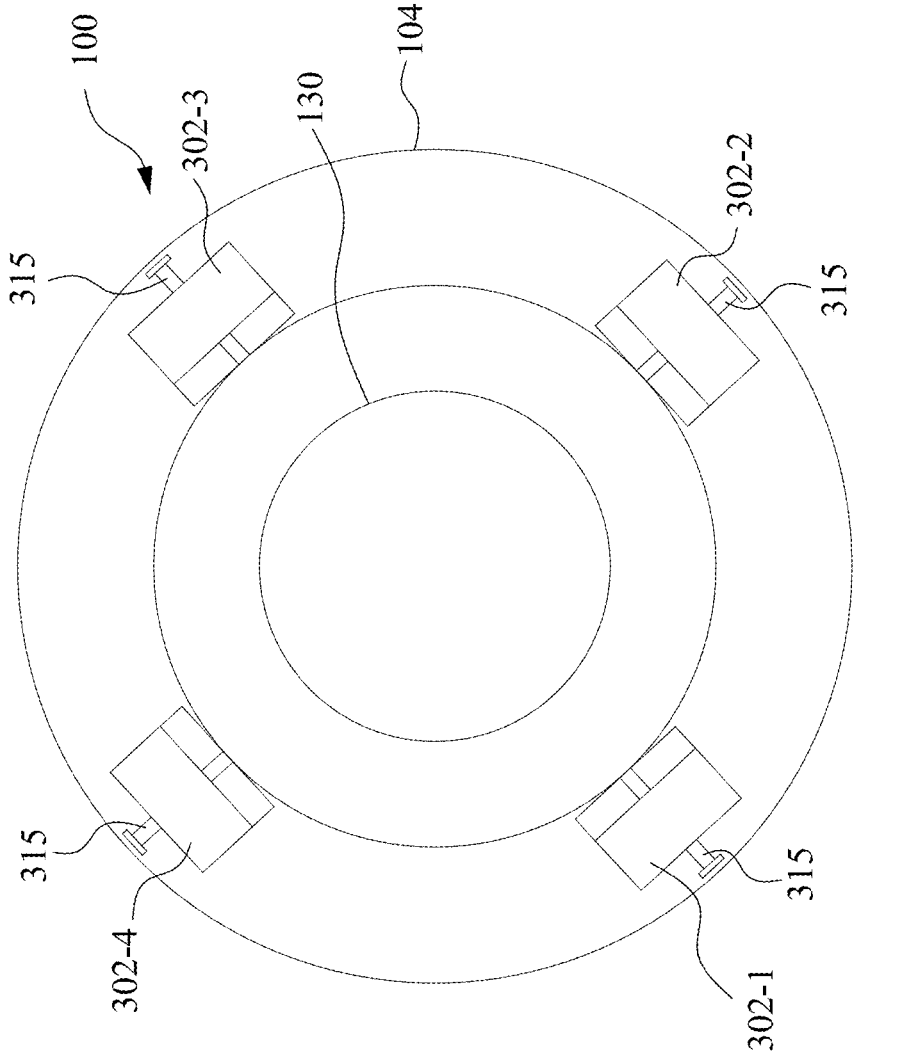
FIG. 3B is a schematic plan view of the chamber of FIG. 1 including the jigs attached thereto, according to embodiments of the disclosure.
Figure 3C:
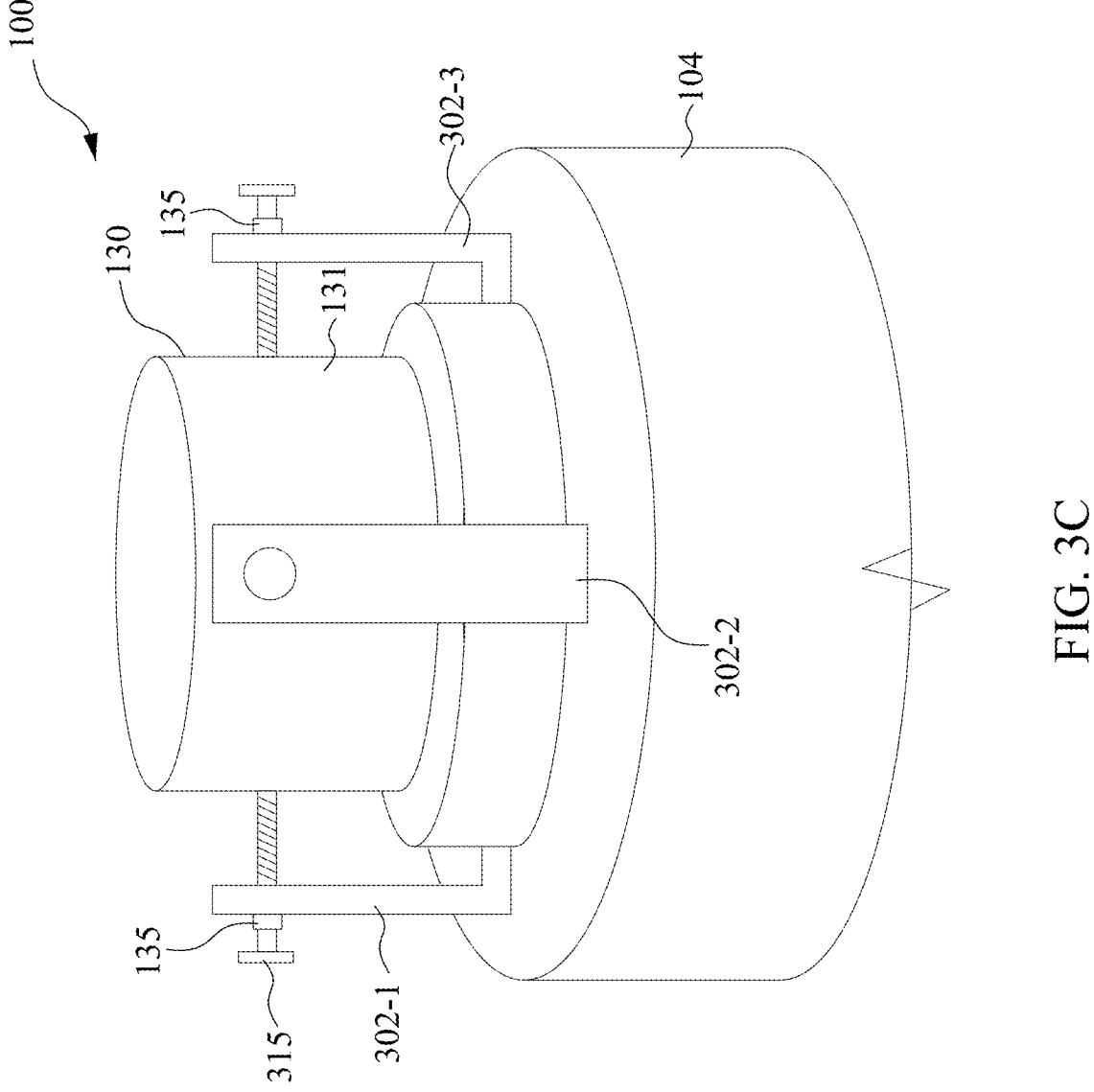
FIG. 3C is a side view of the chamber of FIG. 1 with the jigs attached thereto, according to embodiments of the disclosure.

FIG. 3B is a schematic plan view of the chamber 100 including the jigs 302 attached thereto and the screws 315 contacting the resonator housing 130, according to embodiments of the disclosure. FIG. 3C is a side view of the chamber 100 with the jigs 302 attached thereto. The jig 302-4 is hidden from view in FIG. 3C. As illustrated, each jig 302 is attached to the outer wall 104 and faces the outer surface 131 of the resonator housing 130. In some embodiments, and as illustrated, the jigs 302 are angularly separated from each other at regular intervals, e.g., 90°. However, in other embodiments, the jigs 302 are separated from each other by desired intervals, without departing from the scope of the disclosure. In some embodiments, three jigs are provided with 120° intervals, and in other embodiments, N jigs are provided with 360°/N degree internals (N=2, 3, 4, 5, 6, 7, 8, 9 or 10).

In some embodiments, the jigs 302 have a different structure, configuration and/or arrangement from the pre-existing holes 305. For example, the total number of the pre-existing holes is different from the total number of the jigs 302. In some embodiments, not all pre-existing holes are used for the jigs.

In some embodiments, all jigs have the same structure. In some embodiments, the structures of the jigs 302-1 and 302-2 are the same but are different from that of the jigs 302-3 and 302-4. In some embodiments the number of holes for the jigs 302-1 and 302-2 (pair) is different from the number of holes for the jigs 302-3 and 302-4 (pair). In other embodiments, the structures of the jigs 302-1 and 302-3 are the same but are different from that of the jigs 302-2 and 302-4.

Figure 4A:
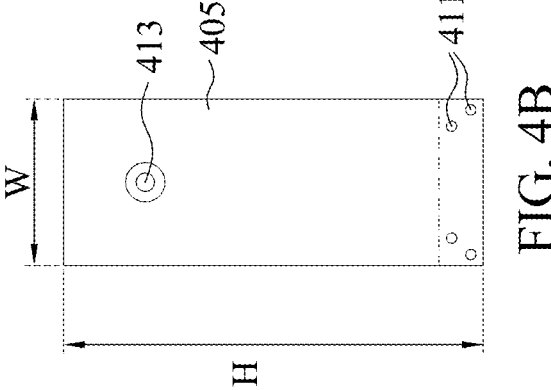
FIG. 4A is a perspective view of a jig of FIGS. 3A-3C.
Figure 4B:
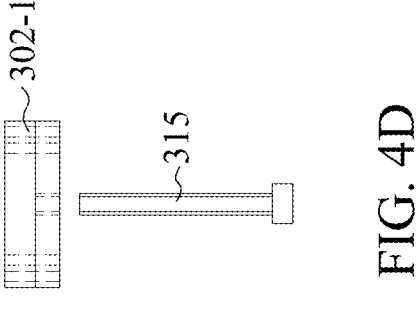
FIG. 4B is a front view of the jig in FIG. 4A.
Figure 4C:
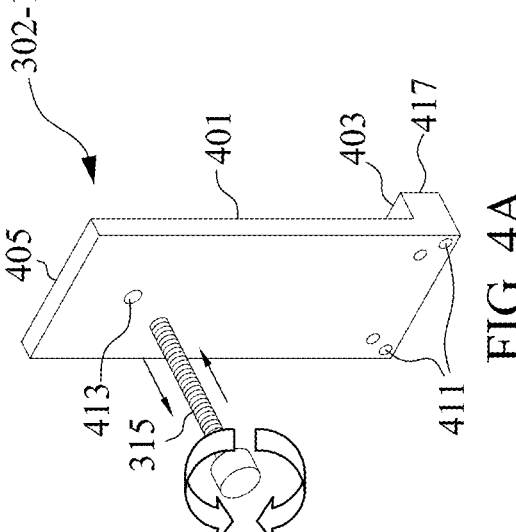
FIG. 4C is a side view of the jig in FIG. 4A.
Figure 4D:
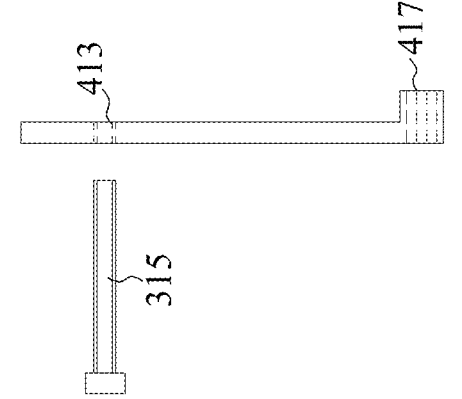
FIG. 4D is a plan view of the jig in FIG. 4A.

FIGS. 4A-4D illustrate different views of the jig 302-1 (or 302-2) in FIGS. 3A-3C, according to embodiments of the disclosure. FIG. 4A is a perspective view of the jig 302-1. FIG. 4B is a front view of the jig 302-1. FIG. 4C is a side view of the jig 302-1. FIG. 4D is a plan view of the jig 302-1. Referring to FIGS. 4A-4D, with continued reference to FIGS. 3A-3C, the jig 302-1 has a generally L-shaped body 401 having a lower portion or base 403 and an upper portion 405 attached to the base 403 and extending transversely to the base 403. In some embodiments, the base 403 and upper portion 405 are at right angles to each other. However, in other embodiments, the base 403 and upper portion 405 can be at any desired angle with respect to each other. The body 401 is constructed from a relatively rigid, non-metallic material. Such a material is resistant to impacts, and general wear and tear, and can operate without failure at lower temperatures. Since the material is non-metallic, interference with RF power is minimized. The material is such that can be machined relatively easily into the desired shape and size. In some embodiments, the material may be or include a polymer. In other embodiments, the material may be or include a metal. In some embodiments, the material includes one or more high-strength and rigid materials, such as polyoxymethylene (POM), polyamide (PA), nylon-6 (PA6), polyethylene terephthalate (PET), polybutylene terephthalate (PBT), and/or polycarbonate (PC). In certain embodiments, POM is used because it is a high-strength and rigid material, has high stiffness, low friction, and excellent dimensional stability.

As illustrated, the base 403 includes four through holes 411 (although more or less can be present) that correspond to the number of holes 305 (FIG. 3A) in the outer wall 104 of the chamber 100 at the location on the chamber 100 where the jig 302-1 is to be installed. The location of the through holes 411 in the base 403 and the spacing between the through holes 411 corresponds to the location and spacing of the holes 305 (FIG. 3A) at the location on the chamber 100 where the jig 302-1 is to be installed. The through holes 411 are sized and shaped (or otherwise configured) to receive fasteners, such as, screws, for coupling the jig 302-1 to the chamber 100. In some embodiments, the jig and/or the fasteners are configured such that the fasteners can be removed and reused, for instance, when replacing a damaged jig. In other words, the jig 302-1 is removably coupled to the chamber 100.

The upper portion 405 of the jig 302-1 includes a through hole 413 that is sized and shaped (or otherwise configured) to receive the screw 315 that can be moved into and out of the through hole 413 in order to contact and separate from the resonator housing 130. The through hole 413 is located in a generally central location of the upper portion 405 towards the top edge of the upper portion 405. However, the through hole 413 can be located at any desired location in the upper portion 405.

In some embodiments, a front face 417 of the base 403 is shaped to match the curvature of outer surface of the chamber 100. Thus, when the base 403 is contacted with the resonator housing 130, the entire front face 417 contact the outer surface 131 of the resonator housing 130.

In some embodiments, the width W of the jig 302-1 is around 78 mm to 80 mm and the height H of the jig 302-1 is around 200 mm to around 210 mm. The width W and the height H (in addition to the location and placement of the through holes 411) are dependent on the placement of the holes 305 at the location on the chamber 100 where the jig 302-1 is to be installed. Thus, in some other embodiments, the width W and the height H can be increased (or decreased) depending on the placement of the holes 305 and/or the location on the chamber 100.

The shape of the jig 302-1 is not limited to the rectangular shape illustrated in FIGS. 4A-4C or any particular shape. For instance, in some other embodiments, the base 403 and/or the upper portion 405 can have rounded corners or can have inclined edges (instead of the straight edge, as illustrated). The jig 302-1 can have any shape and size as required by application and design, without departing from the scope of the disclosure.

Figure 5B:
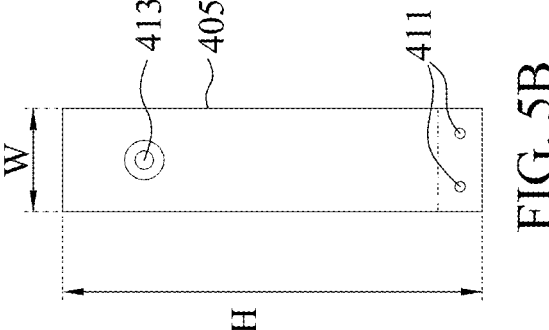
FIG. 5B is a front view of the jig in FIG. 5A.
Figure 5D:
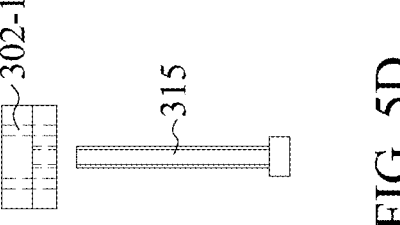
FIG. 5D is a plan view of the jig in FIG. 5A.
Figure 5A:
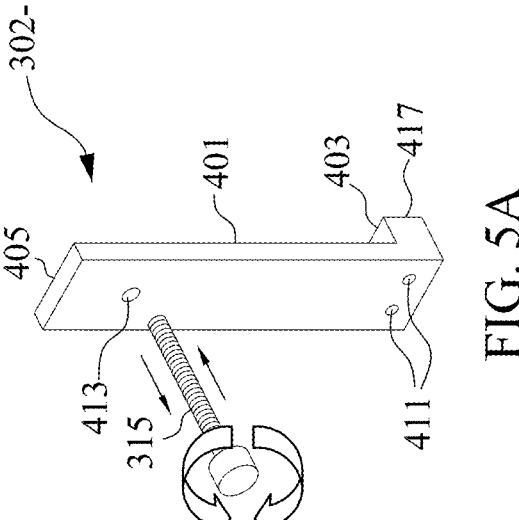
FIG. 5A is a perspective view of a jig in FIGS. 3A-3C.
Figure 5C:
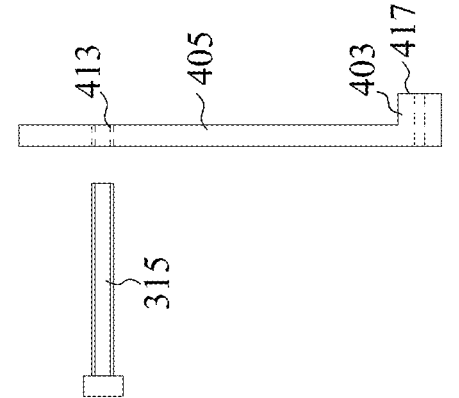
FIG. 5C is a side view of the jig in FIG. 5A.

FIGS. 5A-5D illustrate different views of the jig 302-3 (or 302-4) in FIGS. 3A-3C, according to embodiments of the disclosure. FIG. 5A is a perspective view of the jig 302-3. FIG. 5B is a front view of the jig 302-3. FIG. 5C is a side view of the jig 302-3. FIG. 5D is a plan view of the jig 302-3. The jig 302-3 (or 302-4) may be similar in some respects to the jig 302-1 (or 302-2), and therefore may be best understood with reference thereto where like numerals designate like components not described again in detail.

As illustrated, the base 403 includes two through holes 411 (although more or less can be present) that correspond to the number of holes 305 (FIG. 3A) in the outer wall 104 of the chamber 100 at the location on the chamber 100 where the jig 302-3 is to be installed. The location of the through holes 411 in the base 403 and the spacing between the through holes 411 corresponds to the location and spacing of the holes 305 (FIG. 3A) at the location on the chamber 100 where the jig 302-3 is to be installed. The through holes 411 are sized and shaped (or otherwise configured) to receive fasteners, such as, screws, for coupling the jig 302-3 to the chamber 100. In some embodiments, the jig and/or the fasteners are configured such that the fasteners can be removed and reused, for instance, when replacing a damaged jig. In other words, the jig 302-3 is removably coupled to the chamber 100.

In some embodiments, the width W of the jig 302-3 is around 45 mm to 50 mm and the height H of the jig 302-3 is around 200 mm to around 210 mm. The width W and the height H (in addition to the location and placement of the through holes 411) of the jig 302-3 is dependent on the placement of the holes 305 at the location on the chamber 100 where the jig 302-3 is to be installed. Thus, in some other embodiments, the width W and the height H can be increased (or decreased) depending on the placement of the holes 305 and/or the location on the chamber 100.

The shape of the jig 302-1 is not limited to the rectangular shape illustrated in FIGS. or any particular shape. For instance, in some other embodiments, the base 403 and/or the upper portion 405 can have rounded corners or can have inclined edges (instead of the straight edge, as illustrated). The jig 302-1 can have any shape and size as required by application and design, without departing from the scope of the disclosure.

Although the jigs 302-1 and 302-2 are discussed to have a similar structure, and jigs 302-3 and 302-4 are discussed to have a similar structure, embodiments are not limited thereto. In other embodiments, all jigs 302 have the same structure.

The jigs 302 are attached to the outer wall 104 of the chamber 100 using fasteners at the appropriate locations on the chamber 100 having the holes 305. Once the jigs 302 are installed, and the resonator housing 130 is placed in a correct position, the screws 315 are contacted with the outer surface 131 of the resonator housing 130. The position of each screw 315 is recorded. For instance, a marking is made on each screw or a length of the screw between the outer surface 131 of the resonator housing 130 and surface of the jig 302 facing the resonator housing 130 is measured to record the initial position of the resonator housing 130. In some embodiment, a collar 135 (FIG. 3C) or sleeve on the screw 315 is contacted with the jig 302 to record the initial position of the resonator housing 130. In some embodiments, the jig includes a ruler on the screw for recording the position of the screw.

Pre-clean operations performed in the chamber 100 or maintenance operations performed on the resonator housing 130 can cause the resonator housing 130 to shift from its original position. For example, the vibrations in the resonator housing 130 during the pre-clean operations or the maintenance operations can cause the resonator housing 130 to shift from the initial position. The vibrations and the shifting of the resonator housing 130 also causes the screws 315 to shift in position. Since the original position of the screws 315 has already been recorded, the position of each screw 315 determines the direction in which the resonator housing 130 has shifted. The resonator housing 130 is repositioned (realigned) to the initial position by adjusting the position of one or more screws 315. For instance, depending on shift, the screws 315 can either be moved into or out of the jigs 302 to reposition the resonator housing 130 to its original position. The screws 315 determine whether the resonator housing has been repositioned to the initial position. The position of the resonator housing 130 can thus be fine-tuned to ensure correct repositioning of the resonator housing 130. With the resonator housing 130 in the correct position, the pre-clean process can be performed with high level of accuracy.

In some embodiments, the screws 315 are adjusted by analyzing the wafer map 204 (FIG. 2B) of the surface of the semiconductor substrate W after positional shift. In such embodiments, recording an initial position of the screws 315 can be optional. A controller, e.g., controller 190 (FIG. 1) is programmed with the wafer map 202 (FIG. 2A) of the surface of the semiconductor substrate W before positional shift of the resonator housing 130. After the pre-clean operation on the surface of the semiconductor substrate W, the controller 190 analyzes the wafer map 204 to determine the thickness of the films processed by the pre-clean chamber on different locations on the surface of the semiconductor substrate W.

The screws 315 are connected to motor or actuator that can rotate the screws 315 for moving the screws 315 into and out of the corresponding jigs. The controller 190 can then control the motor or actuator of one or more screws 315 based on the wafer map 204 to correct the positional shift in the resonator housing 130 and relocate the resonator housing 130 to its initial position. In other embodiments, the controller 190 analyzes the wafer map by considering historical data of etch rates, etch conditions, material to be etched. In some embodiments, relationships between the thickness maps and screw positions are obtained and analyzed, and then based on the analyzed data, the controller controls positions of the screw to make the thickness variations within a predetermined value. In some embodiments, instead of the screws, pistons or bars movable by an actuator (motor or a piezo actuator) are used.

Figure 6:
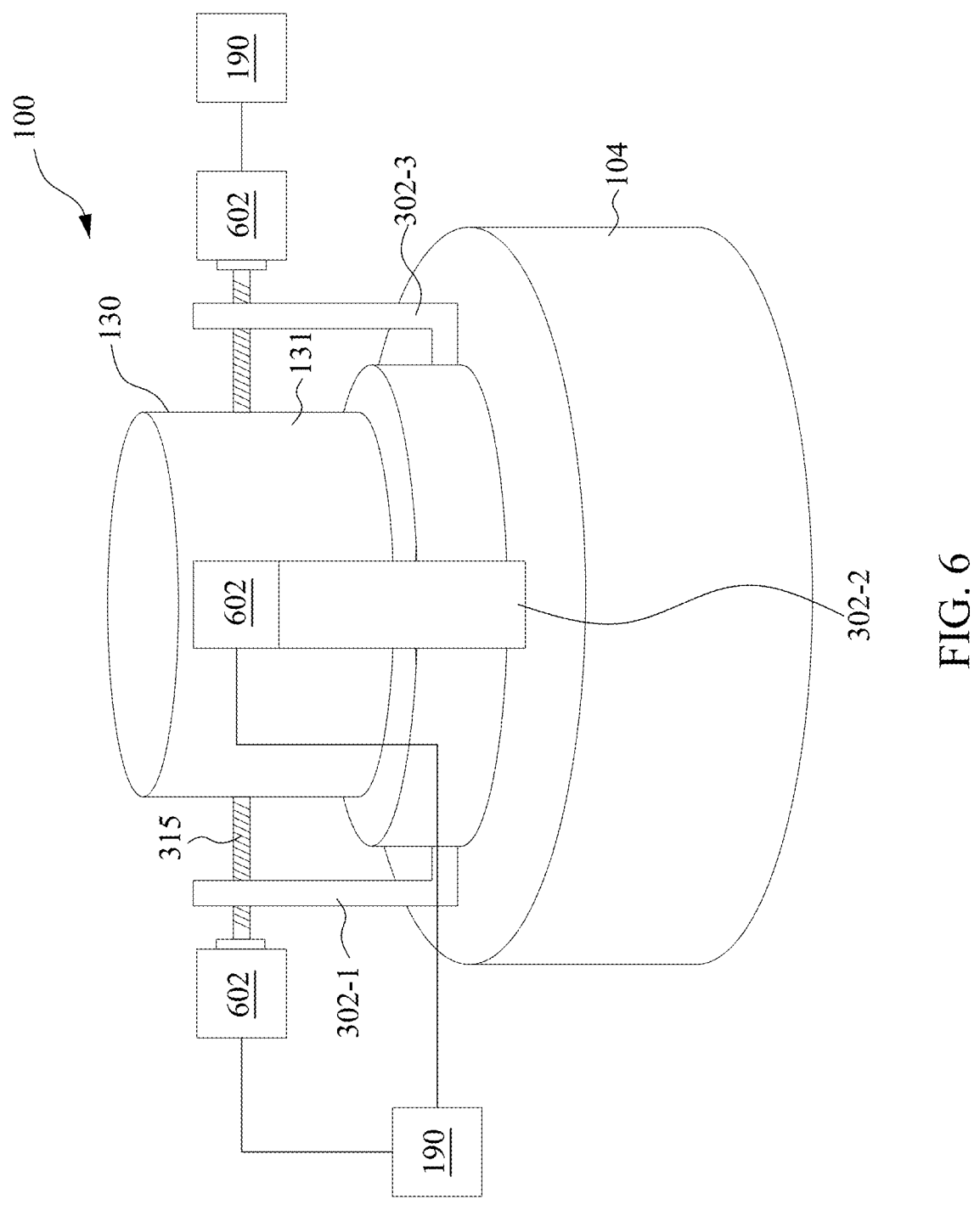
FIG. 6 illustrates the screws in FIG. 3A-3C coupled to a motor or an actuator for rotating the screws, according to embodiments of the disclosure.

FIG. 6 illustrates the screws 315 coupled to a motor 602 (or an actuator) that can rotate the screws 315 for moving the screws 315 into and out of the corresponding jigs for contacting or separating from the resonator housing 130. Each motor 602 is controlled by the controller 190.

Figures 7A, 7B:
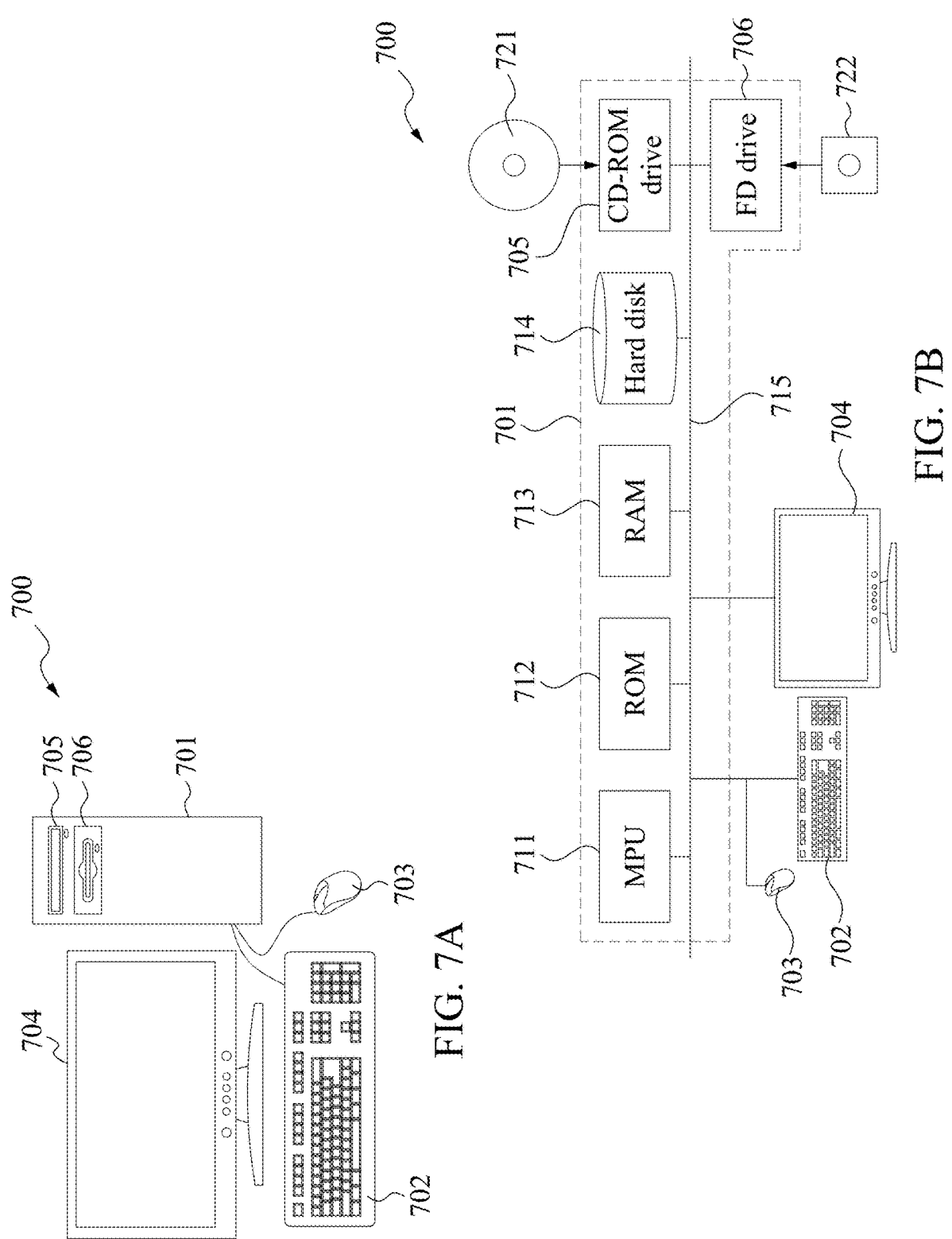
FIGS. 7A and 7B show a controller according to embodiments of the disclosure.

FIG. 7A is a schematic view of a computer system that operates as a controller (e.g., controller 190) for analyzing wafer maps, controlling the screws 315, operating the pre-clean chamber 100, and performing other tasks mentioned in the disclosure. The foregoing embodiments may be realized using computer hardware and computer programs executed thereon. In FIG. 7A, a computer system 700 is provided with a computer 701 including an optical disk read only memory (e.g., CD-ROM or DVD-ROM) drive 705 and a magnetic disk drive 706, a keyboard 702, a mouse 703, and a display 704.

FIG. 7B is a diagram showing an internal configuration of the computer system 700. In FIG. 7B, the computer 701 is provided with, in addition to the optical disk drive 705 and the magnetic disk drive 706, one or more processors 711, such as a micro processing unit (MPU), a ROM 712 in which a program such as a boot up program is stored, a random access memory (RAM) 713 that is connected to the MPU 711 and in which a command of an application program is temporarily stored and a temporary storage area is provided, a hard disk 714 in which an application program, a system program, and data are stored, and a bus 715 that connects the MPU 711, the ROM 712, and the like. Note that the computer 701 may include a network card (not shown) for providing a connection to a LAN.

The program code for causing the computer system 700 to execute the operations/tasks discussed in the foregoing embodiments may be stored in an optical disk 721 or a magnetic disk 722, which are inserted into the optical disk drive 705 or the magnetic disk drive 706, and be transmitted to the hard disk 714. Alternatively, the program may be transmitted via a network (not shown) to the computer 701 and stored in the hard disk 714. At the time of execution, the program is loaded into the RAM 713. The program may be loaded from the optical disk 721 or the magnetic disk 722, or directly from a network.

An embodiment of the present disclosure is a method 800 of determining a change in a position of a resonator housing according to the flowchart illustrated in FIG. 8. It is understood that additional operations can be provided before, during, and after processes discussed in FIG. 8, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S810 of providing a semiconductor processing chamber. The semiconductor processing chamber includes a resonator housing positioned on the semiconductor processing chamber, the resonator housing having a radio frequency (RF) coil disposed within the resonator housing, an RF power source connected to the semiconductor processing chamber for applying RF power to the RF coil, and a plurality of jigs disposed about the resonator housing and attached to the chamber via pre-existing holes in the chamber. In operation S820 a first position of the resonator housing is recorded using the plurality of jigs. In operation S830, the semiconductor processing chamber is operated. In operation S840, a second position of the resonator housing is recorded after operating the semiconductor processing chamber. In operation S850, a shift in the position of the resonator housing is determined based on a difference in the first position and the second position.

Embodiments of the disclosure are directed to recording the original position of the resonator housing and repositioning the housing to its original position. Since the original position has been recorded, the resonator housing can be repositioned to its original position with a high level of accuracy and in relatively less time. The correctly positioned resonator housing ensures a more uniform etching of the semiconductor substrates, and reduces fabrication errors. By attaching the jigs via existing holes in the chamber, costs associated with drilling new holes in the chamber are avoided.

It will be understood that not all advantages have been necessarily discussed herein, no particular advantage is required for all embodiments or examples, and other embodiments or examples may offer different advantages.

According to some embodiments of the present disclosure, a device for a plasma processing chamber includes a base, an upper portion attached to the base and extending transverse to the base, one or more first through holes defined in the base, the one or more first through holes corresponding to one or more openings defined in the plasma processing chamber for attaching the device, a second through hole defined in the upper portion; and a gauge located in the second through hole, the gauge configured for recording a position of the plasma processing chamber and a shift in the position of the plasma processing chamber. In an embodiment, the gauge is a threaded screw and the second through hole is configured for receiving the threaded screw. In an embodiment, location and placement of the one or more first through holes corresponds to location and placement of the one or more openings in the plasma processing chamber. In an embodiment, a shape of a surface of the base corresponds to a shape of an outer surface of the plasma processing chamber. In an embodiment, the base and the upper portion include polyoxymethylene (POM). In an embodiment, the base and the upper portion are perpendicular to each other.

According to some embodiments of the present disclosure, a semiconductor substrate processing apparatus includes a chamber, a resonator housing positioned on the chamber, the resonator housing having a radio frequency (RF) coil disposed within the resonator housing, an RF power source connected to the chamber for applying RF power to the RF coil; and a plurality of jigs disposed about the resonator housing and attached to the chamber via pre-existing holes in the chamber. The plurality of jigs are configured for recording a position of the resonator housing. In an embodiment, each jig includes a base, an upper portion attached to the base and extending vertically from the base, one or more first through holes defined in the base, the one or more first through hole corresponding to the pre-existing holes in the chamber for attaching the jig, a second through hole defined in the upper portion, and a gauge configured for recording the position of the resonator housing. In an embodiment, the gauge is a threaded screw that is located in the second through hole, the second through hole being configured for the threaded screw to more into and out of the second through hole. In an embodiment, each jig and the threaded screw are configured such that a distance between the threaded screw and the resonator housing decreases when the screw is moved into the second through hole, and the distance between the threaded screw and the resonator housing increases when the threaded screw is moved out of the second through hole. In an embodiment, location and placement of the one or more first through holes corresponds to location and placement of the pre-existing holes in the chamber. In an embodiment, a shape of a surface of the base that contacts the resonator housing corresponds to a shape of an outer surface of the resonator housing. In an embodiment, the plurality of jigs include polyoxymethylene (POM).

According to some embodiments of the present disclosure, a method includes providing a semiconductor processing chamber, The semiconductor processing chamber includes a resonator housing positioned on the semiconductor processing chamber, the resonator housing having a radio frequency (RF) coil disposed within the resonator housing, an RF power source connected to the semiconductor processing chamber for applying RF power to the RF coil, and a plurality of jigs disposed about the resonator housing and attached to the semiconductor processing chamber via pre-existing holes in the semiconductor processing chamber. The method further includes recording a first position of the resonator housing using the plurality of jigs, operating the semiconductor processing chamber, recording a second position of the resonator housing after operating the semiconductor processing chamber, and determining a shift in the position of the resonator housing based on a difference in the first position and the second position. In an embodiment, each jig includes a threaded screw, and recording the first position of the resonator housing includes contacting the threaded screws to an outer surface of the resonator housing, and recording a position of each threaded screw in the jig. In an embodiment, recording the second position of the resonator housing includes recording a change in the position of the resonator housing from the first position to the second position. In an embodiment, the method further includes adjusting one or more threaded screws to relocate the resonator housing to the first position. In an embodiment, each jig of the plurality of jigs includes a plurality of first through holes, and a placement of the plurality of first through holes corresponds to a placement of the pre-existing holes in the semiconductor processing chamber at a location on the semiconductor processing chamber where the jig is attached. In an embodiment, wherein each jig includes a base, an upper portion attached perpendicular to the base, the plurality of first through holes defined in the base, a second through hole defined in the upper portion, and a gauge for recording the first position and the second position of the resonator housing. In an embodiment, the plurality of jigs include polyoxymethylene (POM).

In accordance with another aspect of the disclosure, in a method using a semiconductor processing chamber, the semiconductor processing chamber includes a resonator housing positioned on the semiconductor processing chamber, the resonator housing having a radio frequency (RF) coil disposed within the resonator housing, an RF power source connected to the semiconductor processing chamber for applying RF power to the RF coil, and a plurality of jigs disposed about the resonator housing and attached to the semiconductor processing chamber via pre-existing holes in the semiconductor processing chamber. The method includes recording a first position of the resonator housing using the plurality of jigs, performing one or more operations using or on the semiconductor processing chamber, recording a second position of the resonator housing after operating the semiconductor processing chamber, and determining a shift in the position of the resonator housing based on a difference in the first position and the second position. In one or more of the foregoing or following embodiments, the one or more operations includes a maintenance operation. In one or more of the foregoing or following embodiments, each jig includes a threaded screw, and recording the first position of the resonator housing includes contacting the threaded screws to an outer surface of the resonator housing, and recording a position of each threaded screw in the jig. In one or more of the foregoing or following embodiments, recording the second position of the resonator housing includes recording a change in the position of the resonator housing from the first position to the second position. In one or more of the foregoing or following embodiments, the method further includes adjusting one or more threaded screws to relocate the resonator housing to the first position. In one or more of the foregoing or following embodiments, the method further includes, after the adjusting performing a semiconductor manufacturing operation to process a semiconductor wafer. In one or more of the foregoing or following embodiments, the semiconductor manufacturing operation includes one or more of a pre-clean operation, a deposition operation or an etching operation. In one or more of the foregoing or following embodiments, each jig of the plurality of jigs includes a plurality of first through holes, and a placement of the plurality of first through holes corresponds to a placement of the pre-existing holes in the semiconductor processing chamber at a location on the semiconductor processing chamber where the jig is attached. In one or more of the foregoing or following embodiments, each jig includes a base, an upper portion attached perpendicular to the base, the plurality of first through holes defined in the base, a second through hole defined in the upper portion, and a gauge for recording the first position and the second position of the resonator housing. In one or more of the foregoing or following embodiments, the plurality of jigs include poly-oxymethylene (POM).

In accordance with another aspect of the present disclosure, in a method for using a semiconductor processing chamber, the semiconductor processing chamber includes a resonator housing positioned on the semiconductor processing chamber, the resonator housing having a radio frequency (RF) coil disposed within the resonator housing, an RF power source connected to the semiconductor processing chamber for applying RF power to the RF coil, and a plurality of jigs disposed about the resonator housing and attached to the semiconductor processing chamber via pre-existing holes in the semiconductor processing chamber. The method includes performing one or more operations using or on the semiconductor processing chamber, the one or more operations causes a shift of the RF power source, adjusting one or more of the plurality of jigs so that the RF power source is positioned on the semiconductor processing chamber within a predetermined margin, and performing a semiconductor manufacturing process on a semiconductor wafer. In one or more of the foregoing or following embodiments, the one or more operations include a preventive maintenance operation. In one or more of the foregoing or following embodiments, the one or more operations comprise wafer handling. In one or more of the foregoing or following embodiments, the semiconductor manufacturing operation includes one or more of a pre-clean operation, a deposition operation or an etching operation. In one or more of the foregoing or following embodiments, each of the plurality of jigs comprises a base, an upper portion attached to the base and extending transverse to the base, one or more first through holes defined in the base, the one or more first through holes corresponding to one or more openings defined in the semiconductor processing chamber for attaching the device, a second through hole defined in the upper portion, and a gauge located in the second through hole, the gauge configured for recording a position of the semiconductor processing chamber and a shift in the position of the semiconductor processing chamber.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device for a plasma processing chamber, comprising:
   a base;
   an upper portion attached to the base and extending transverse to the base;
   one or more first through holes defined in the base, the one or more first through holes corresponding to one or more openings defined in the plasma processing chamber for attaching the device;
   a second through hole defined in the upper portion; and
   a gauge located in the second through hole, the gauge configured for recording a position of the plasma processing chamber and a shift in the position of the plasma processing chamber.

2. The device of claim 1, wherein the gauge is a threaded screw and the second through hole is configured for receiving the threaded screw.

3. The device of claim 1, wherein location and placement of the one or more first through holes corresponds to location and placement of the one or more openings in the plasma processing chamber.

4. The device of claim 1, wherein a shape of a surface of the base corresponds to a shape of an outer surface of the plasma processing chamber.

5. The device of claim 1, wherein the base and the upper portion include polyoxymethylene (POM).

6. The device of claim 1, wherein the base and the upper portion are perpendicular to each other.

7. A semiconductor substrate processing apparatus, comprising:
   a chamber;
   a resonator housing positioned on the chamber, the resonator housing having a radio frequency (RF) coil disposed within the resonator housing;
   an RF power source connected to the chamber for applying RF power to the RF coil; and
   a plurality of jigs disposed about the resonator housing and attached to the chamber via pre-existing holes in the chamber, the plurality of jigs being configured for recording a position of the resonator housing.

8. The semiconductor substrate processing apparatus of claim 7, wherein each jig includes
   a base;
   an upper portion attached to the base and extending vertically from the base;
   one or more first through holes defined in the base, the one or more first through holes corresponding to the pre-existing holes in the chamber for attaching the jig;
   a second through hole defined in the upper portion; and
   a gauge configured for recording the position of the resonator housing.

9. The semiconductor substrate processing apparatus of claim 8, wherein the gauge is a threaded screw that is located in the second through hole, the second through hole being configured for the threaded screw to move into and out of the second through hole.

10. The semiconductor substrate processing apparatus of claim 9, wherein each jig and the threaded screw are configured such that a distance between the threaded screw and the resonator housing decreases when the threaded screw is moved into the second through hole, and the distance between the threaded screw and the resonator housing increases when the threaded screw is moved out of the second through hole.

11. The semiconductor substrate processing apparatus of claim 8, wherein location and placement of the one or more first through holes corresponds to location and placement of the pre-existing holes in the chamber.

12. The semiconductor substrate processing apparatus of claim 8, wherein a shape of a surface of the base that contacts the resonator housing corresponds to a shape of an outer surface of the resonator housing.

13. The semiconductor substrate processing apparatus of claim 7, wherein the plurality of jigs include polyoxymethylene (POM).

14. A system for operating a semiconductor substrate processing apparatus, comprising:

a controller including a processor and a memory;

an actuator operationally coupled to the controller;

a plasma processing chamber;

a resonator housing positioned on the plasma processing chamber, the resonator housing having a radio frequency (RF) coil disposed within the resonator housing;

an RF power source connected to the plasma processing chamber for applying RF power to the RF coil; and a plurality of jigs disposed about the resonator housing and attached to the plasma processing chamber via pre-existing holes in the plasma processing chamber, the plurality of jigs being configured for recording a position of the resonator housing, wherein the controller is programmed to analyze a wafer map of a surface of a semiconductor substrate in the plasma processing chamber, and using the wafer map, determine a position of the resonator housing from an initial position; and control the actuator to adjust one or more of the plurality of jigs to adjust the position of the resonator housing.

15. The system of claim 14, wherein the initial position is the position of the resonator housing prior to operating the plasma processing chamber, and the controller is programmed to analyze the wafer map to determine a difference between the initial position and a position after operating the plasma processing chamber.

16. The system of claim 15, wherein the controller is programmed to control the actuator to adjust the one or more of the plurality of jigs to relocate the resonator housing to the initial position.

17. The system of claim 14, wherein each jig includes:

a base;

an upper portion attached to the base and extending vertically from the base;

one or more first through holes defined in the base, the one or more first through holes corresponding to the pre-existing holes in the plasma processing chamber for attaching the jig;

a second through hole defined in the upper portion; and a threaded screw located in the second through hole for recording the initial position of the resonator housing, wherein the controller is programmed to control the actuator to move the threaded screw in the second through hole to relocate the resonator housing to the initial position.

18. The system of claim 17, wherein each jig and the threaded screw are configured such that a distance between the threaded screw and the resonator housing decreases when the threaded screw is moved into the second through hole, and the distance between the threaded screw and the resonator housing increases when the threaded screw is moved out of the second through hole.

19. The system of claim 17, wherein location and placement of the one or more first through holes corresponds to location and placement of the pre-existing holes in the plasma processing chamber.

20. The system of claim 14, wherein the controller is programmed to resume operation of the plasma processing chamber after the position of the resonator housing is adjusted.

\* \* \* \* \*